United States Patent [19]

Patel et al.

[11] Patent Number: 5,196,851
[45] Date of Patent: Mar. 23, 1993

[54] LINEARIZING NON-LINEAR ANALOG-TO-DIGITAL PROCESS AND CIRCUIT

[75] Inventors: Chandrakant B. Patel, Hopewell; Thomas Meyer, Merceville, both of N.J.

[73] Assignee: Samsung Electronics Co., Ltd., Suwon, Rep. of Korea

[21] Appl. No.: 704,986

[22] Filed: May 24, 1991

[51] Int. Cl.$^5$ .............................................. H03M 1/10
[52] U.S. Cl. ..................................... 341/140; 341/118
[58] Field of Search ................ 341/118, 120, 155, 106, 341/119, 121, 122, 124, 125, 138, 140, 141; 364/570, 571.01, 571.04, 571.07

[56] References Cited

U.S. PATENT DOCUMENTS

4,764,751  8/1988  Kimura ................................. 341/140
5,047,769  9/1991  Engeler et al. ...................... 341/118

*Primary Examiner*—Sharon D. Logan
*Assistant Examiner*—B. K. Young
*Attorney, Agent, or Firm*—Robert E. Bushnell

[57] ABSTRACT

A circuit for linearizing analog-to-digital output is shown in FIG. 2, with an analog signal $V_i$ transmitted by input circuit 10 is applied to an input port of an analog-to-digital converter 12 controlled by a sampling signal $V_s$, to provide digital data $V_d$ on an "N" bit data bus 14. An analog-to-digital linearizing memory 16 storing a look-up table of digital values, is coupled to bus 14 to receive the digital data $V_d$, and to respond to the digital data $V_d$ by providing true linear digital values from the look-up table to digital data processing system DSP 20 via an "N" bit data bus 18. A microprocessor 22 is temporarily coupled between the output port of converter 12 and the input port of memory 16 via bus 14, to serve as a switch between bus 14 and a programming memory 24 containing a table of true linear digital values $V_t$. A known test signal is applied to input circuit 10, and true linear digital values $V_t$ stored in programming memory 24, are then read into linearizing memory 16 to provide an accurate and reliable relation to a characteristic such as the amplitude of each step of the known test signal over the entire range of the known test signal.

7 Claims, 6 Drawing Sheets

$$Y_T = A_T + \frac{(Y - A)}{(B - A)} \cdot (B_T - A_T)$$

A/D OUT
DOTTED: THEORETICAL RESPONSE
SOLID: PROCESSED RESPONSE

FIG.7C

LINEARIZING NON-LINEAR ANALOG-TO-DIGITAL PROCESS AND CIRCUIT

FIELD OF THE INVENTION

The current invention relates to processing of digital signals and, more particularly, to processes and circuits for converting analog signals into digital representations of those analog signals.

BACKGROUND

Digital signal processing (DSP) systems usually have an analog-to-digital converter as an input link from the analog domain. An analog-to-digital converter is always assumed to provide a digital signal based on the input level. For a given peak-to-peak input of $V_{pp}$, an A/D converter generates a given number of codes at its output port. Consequently, the input-to-output linearity of an A/D converter is very important.

Currently available high priced analog-to-digital converters have one or more linearity controls. These controls allow the user to adjust the output for a given input (e.g., either 50%, or 25% and 75%) level to obtain a linear output. Frequently however, there is some non-linearity in the intermediate input levels.

For commercial grades of consumer appliances using mass production quality analog-to-digital converters such as video signal products, it is imperative that the degree of non-linearity of the analog-to-digital converter be kept under control. For example, in deghoster circuits, the ghost parameters may be computed from a transition in a given region; by way of illustration, a vertical synchronization signal ($-40$ to $0$ IRE) or $0 \rightarrow 70$ IRE broadcast television (i.e., a BTA) signal. Then, the entire $-40$ to $\approx 120$ IRE video signal is "deghosted" based on these parameters. Thus, for reliable deghosting performance, the "assumed" linearity of the signal is extremely important.

Earlier efforts by others to obtain particular output characteristics from analog-to-digital converters have tended toward two different approaches. One approach used an expensive, high-quality analog-to-digital converter designed to include adjustable gain and phase stages. Prior to use, each of the adjustable stages would necessarily be "tuned" to give optimal output characteristics. Cost of the converter, and the time consumed in making the adjustments, are two problems attendant to the first approach. Consequently, the use of such converters is limited to customized, expensive applications.

The second approach, as represented by Kimura, U.S. Pat. No. 4,764,751, applies the output signal "z" from a non-linear analog-to-digital conversion circuit to a look-up table memory containing straight line conversion data, in an effort to obtain compensated digital values "z'" stored in the look-up table, and to thereby provide a conversion exhibiting a particular non-linear (e.g., logarithmic) characteristic. Several stages are coupled to the input port of the non-linear analog-to-digital conversion circuit to adjust offset and gain of the analog signals being applied to the conversion circuit. This approach however, requires measurement of conversion characteristic data of the non-linear analog-to-digital converter, calibration of the conversion characteristic data curve at an origin and at the maximum output value (e.g., $2^N-1$) as part of a normalization and curve-fitting step, and calculation of compensated digital values corresponding to the level of the input signal in terms of reference data and the conversion characteristic data. Consequently, because this approach necessarily demands reliance upon offset and gain adjustment stages, the use of a specialized digital-to-analog converters, and measurement of the conversion characteristic data of the converters, it is unsuitable for use with mass production quality analog-to-digital converters. Moreover, this approach neither recognizes, nor addresses the problem of improving the linearity of conversion by linear digital-to-analog converters at values intermediate to the two extremes of the range of conversion.

SUMMARY OF THE INVENTION

Accordingly, it is one object of the currently disclosed invention to provide an improved process and circuit for performing digital-to-analog conversion.

It is another object to provide a process and circuit exhibiting an enhanced degree of linearity in conversion of analog-to-digital signals.

It is still another object to provide a process and circuit suitable for inexpensively correcting deviations in the linearity of mass produced analog-to-digital converters.

It is yet another object to provide a process and circuit characterized by an enhanced input to output linearity of digital-to-analog conversion independently of offset, gain and phase adjustments.

These and other objects are achieved with a process and circuit using a memory storing linearizing data values interposed between an analog-to-digital converter and a digital signal processing system. A known analog test signal such as a ten step IRE staircase, is incrementally applied to an input port of the digital-to-analog converter while a programming stage applies digital values for the known analog signal amplitudes to the memory at each of the steps to assure coincidence between the provisional digital signal generated by the analog-to-digital converter and the corresponding addresses of the linear digital values stored within the memory. Once corresponding addresses for the linear digital values are stored within the memory, the programming stage is removed and the serially coupled analog-to-digital converter and memory will reliably provide a greater degree of linearity between the analog signals applied to the converter and the digital values emanating from the memory.

BRIEF DESCRIPTION OF THE DRAWINGS

A more complete appreciation of the inventions, and many of the attendant advantages thereof, will be readily enjoyed as the same becomes better understood by reference to the following detailed description when considered in conjunction with the accompanying drawings in which like numbers indicate the same or similar components, wherein.

DETAILED DESCRIPTION OF THE INVENTION

Figure 1:
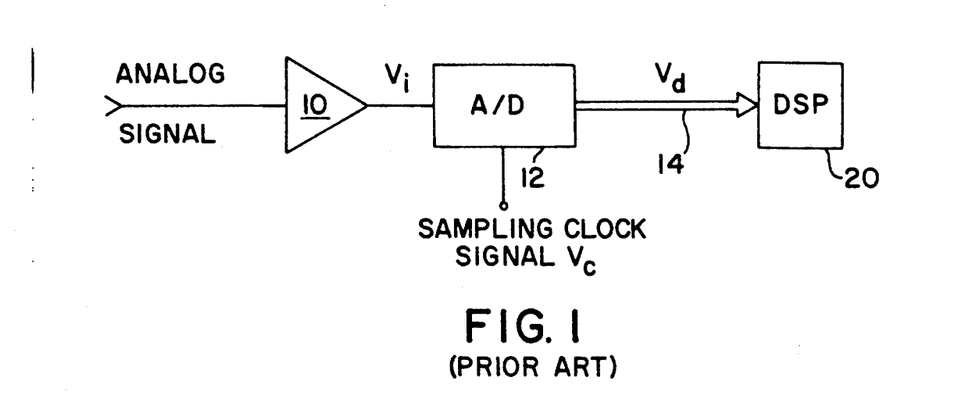
FIG. 1 is a schematic block diagram of a conventional application of an analog-to-digital converter.
Figure 4:
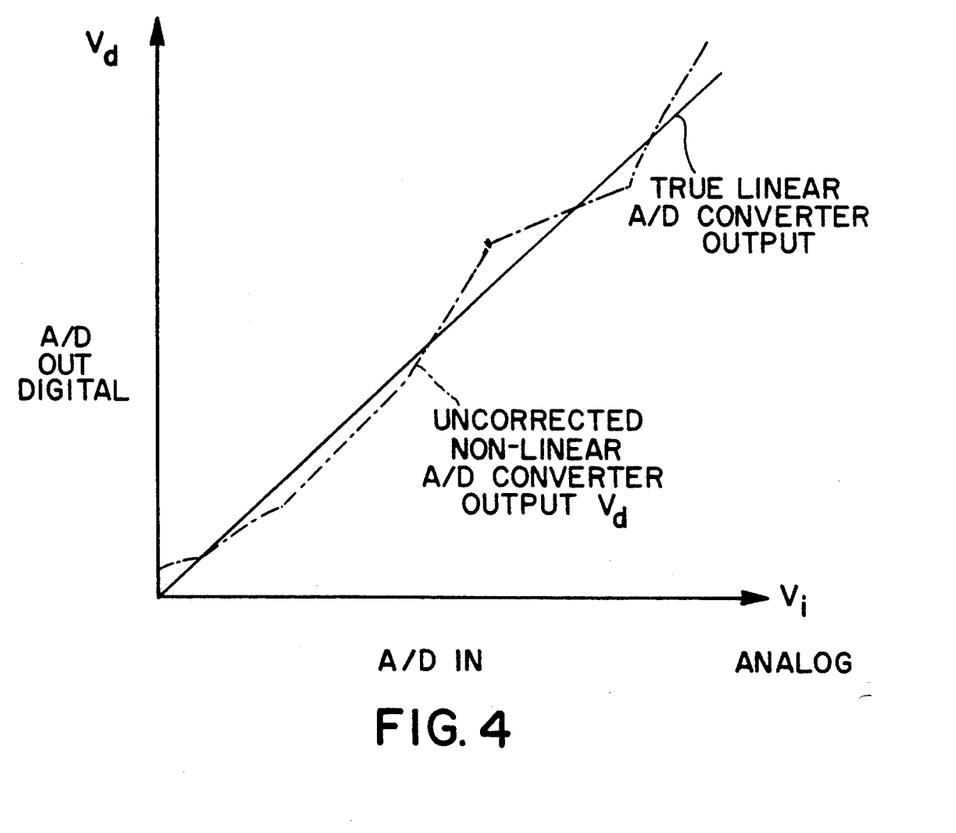
FIG. 4 is a two coordinate graphical illustration of deviations in the degree of linearity occurring in a representative commercially available analog-to-digital converter.

Referring now to FIG. 1, a schematic illustration of a representative conventional digital signal processing system is shown. Such systems usually have an analog-to-digital converter as an input link from the analog domain. In the system of FIG. 1, an analog signal is applied to an input port of an input circuit 10 which includes a gain adjustment stage, a direct current offset adjustment stage, and a clamp. The analog clock $V_c$ transmitted by input circuit 10 is applied to an input port of an analog-to-digital converter 12 controlled by a sampling clock $V_c$, to provide digital data $V_d$ on an "N" bit data bus 14 to a digital data processing system DSP 20. Referring now to FIG. 4, a comparison of the uncorrected digital data $V_d$ generated by converter 12 against the straight-line labelled "true linear analog-to-digital output, shows that the digital data $V_d$ deviates almost continuously over the range of conversion of converter 12, from a desired true linear relation between the analog-to-digital input analog signal $V_i$ applied to the input port of converter 12 and the digital data $V_d$ generated by converter 12.

Figure 2:
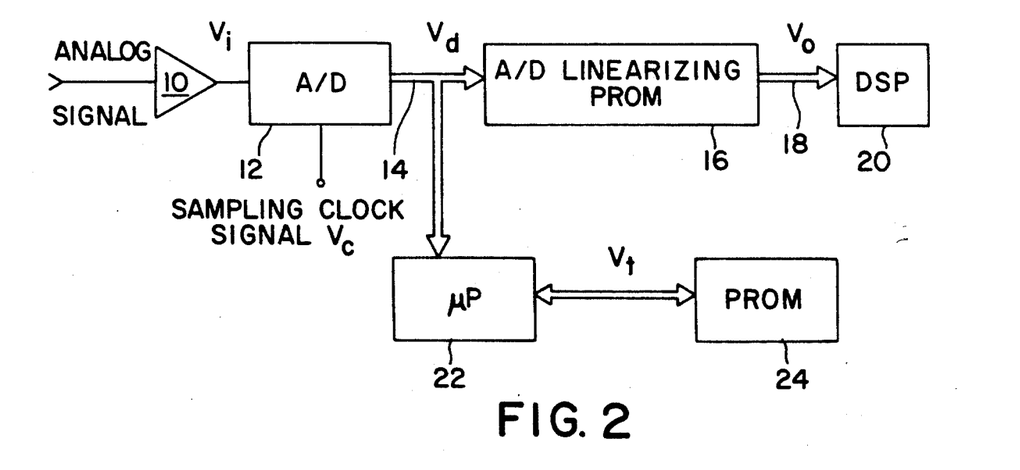
FIG. 2 is a schematic block diagram of an analog-to-digital converter circuit constructed according to the principles of the currently disclosed invention.

A very simple circuit for linearizing analog-to-digital output according to the principles of the current inventions, is illustrated in FIG. 2. As was shown in FIG. 1, the analog signal $V_i$ transmitted by input circuit 10 is applied to an input port of an analog-to-digital converter 12 controlled by a sampling clock signal $V_c$, to provide digital data $V_d$ on an "N" bit data bus 14.

An analog-to-digital linearizing memory 16, such as, for example, a programmable read-only-memory storing a look-up table of digital values, is coupled to bus 14 to receive the digital data $V_d$, and to respond to the digital data $V_d$ by providing true linear digital values from the look-up table to digital data processing system DSP 20 via an "N" bit data bus 18.

A microprocessor 22 may be temporarily coupled between the output port of converter 12 and the input port of memory 16 via bus 14, to serve as a switch between bus 14 and a programming memory 24 containing a table of true linear digital values $V_t$.

Figure 3:
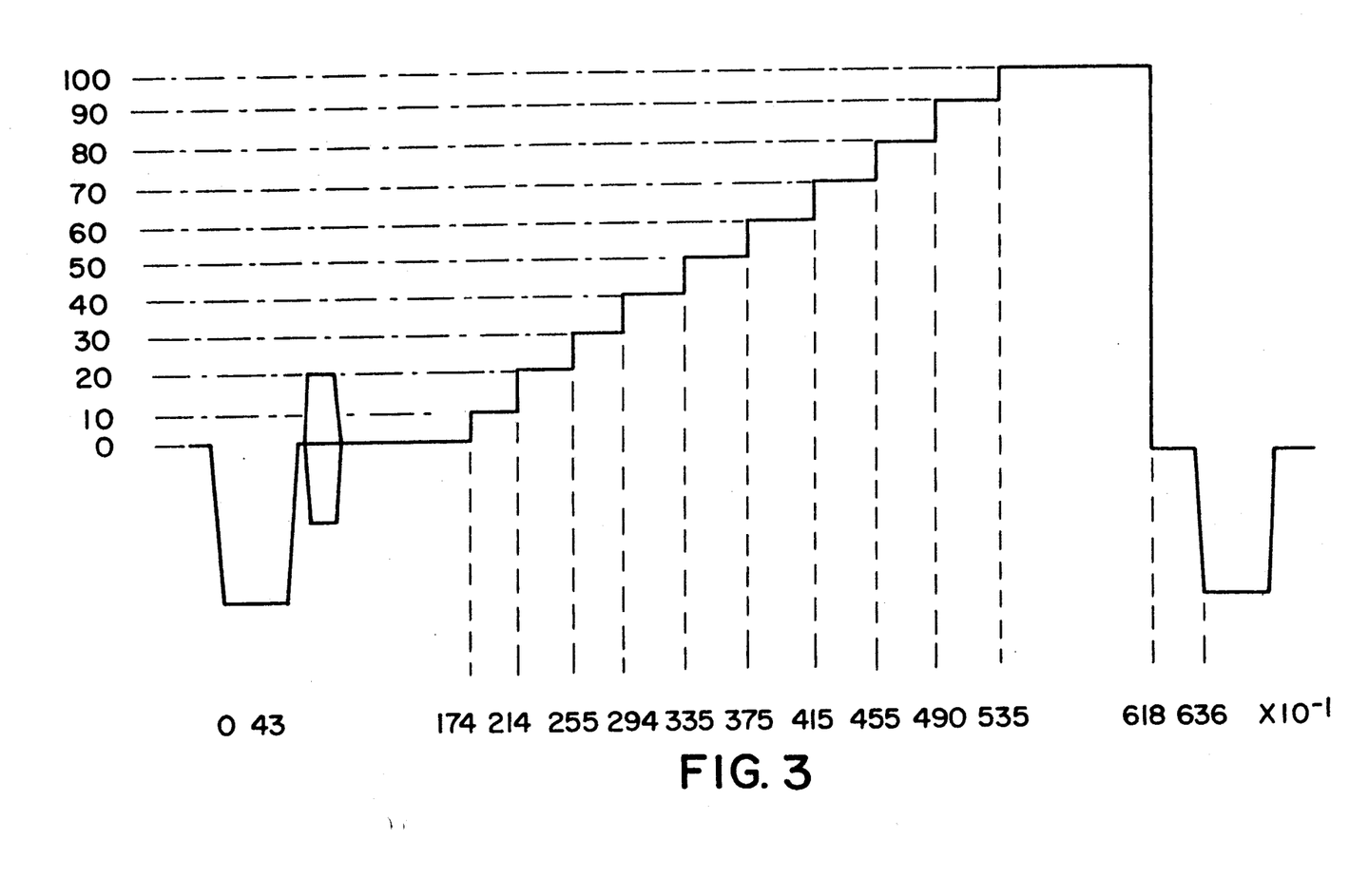
FIG. 3 is a graphical representation of a ten step IRE staircase signal.

A known test signal such as a ten step IRE staircase signal, as shown in FIG. 3, may be used as the analog input signal applied to input circuit 10. In such an instance, the true linear digital values $V_t$ stored in programming memory 24 provide an accurate and reliable relation to a characteristic such as the amplitude of each step of the known test signal over the entire range of the known test signal. An IRE zone shown along the abscissa of the graph in FIG. 3, is defined as an output range between the levels captured from the test signal. A, and B are analog-to-digital output values defining the Kth zone for input level or interval $V_k$ to $V_{k+1}$. $A_T$, an $B_T$, are corresponding correct (true linear) values for that zone. Then, a corrected value $Y_T$ for the digital value Y of the non-linear analog-to-digital may be computed as:

$$Y_T = A_T + [(B_T - A_T)] * [(y - A) \div (B - A)] \quad (1)$$
$$= [A_T - [(B_T - A_T) \div (B - A)] * A] + \quad (2)$$
$$[(B_T - A_T) \div (B - A)] * y$$
$$= C_k + D_k * y \quad (3)$$

where $C_k$ and $D_k$ are the parameters computed for the $K_{th}$ zone from its measured values of A and B for a given analog-to-digital device with corresponding theoretical analog-to-digital output values of $A_T$ and $B_T$.

Figure 5:
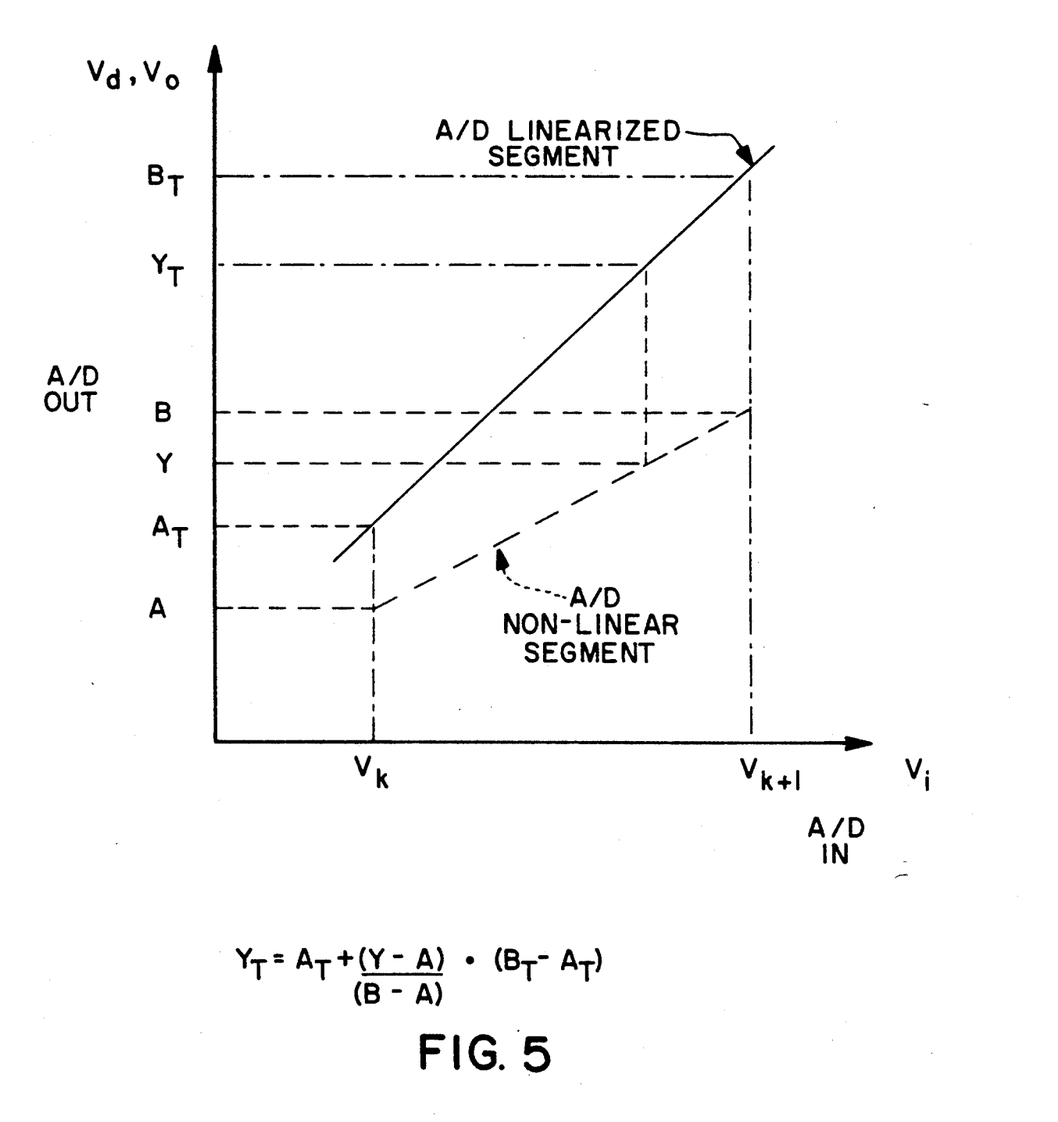
FIG. 5 is a two coordinate graphical illustration of one implementation of a process for performing analog-to-digital conversion according to the principles of the currently disclosed invention.

The analog-to-digital output that results from a known test signal such as a ten step IRE staircase signal, is gated to microprocessor 22, for example, for a nine bit analog-to-digital converter 12, after basic gain and direct current offset are adjusted within input circuit 10 for a 0 to +1 $V_{pp}$ signal input. The analog-to-digital output digital value will therefore range by $2^N$, with N=9, from −256 to +255 in offset two's complement. Microprocessor 22 obtains true digital values $V_t$ from the look-up table stored within programming memory 24, for the known IRE levels. Correct digital values for each of these levels of amplitude of the IRE staircase test signal are known for the designated analog-to-digital device, and are stored within a look-up table within programming memory 24. In response to application of each of the levels of the IRE staircase test signal to input circuit 10, microprocessor 22 reads the corresponding true digital value $V_t$ from programming memory 24 and stores that true digital value within the look-up table of linearizing memory 16, the corresponding true digital value, with the address of each of the true digital values stored within linearizing memory 16 being the corresponding uncorrected digital data $V_d$ generated by converter 12. A microprocessor 22 is programmed to determine values between steps of an input signal analytically, as shown in FIG. 5 for the step of $V_k$ to $V_{k+1}$. After all of the true digital values over the range of converter 12 are stored within the look-up table of linearizing memory 16 at address corresponding to the values of digital data $V_d$ generated by converter 12 in response to input of each of the levels of the known test signal, microprocessor 22 and programming memory 24 are removed and a linear analog-to-digital converter including input circuit 10, converter 12 and linearizing memory 16 are able to accurately generate digital values $V_o$ exhibiting a true linear relation with a characteristic, such as amplitude, of an input analog signal $V_i$, over the entire range of converter 12. Thus, the input-to-output non-linearity intrinsic to a mass production quality analog-to-digital converter 12 can be reliably and inexpensively eliminated, or greatly reduced, simply by generating appropriate mapping via a read only memory (i.e., a "ROM") 16.

Figure 6:
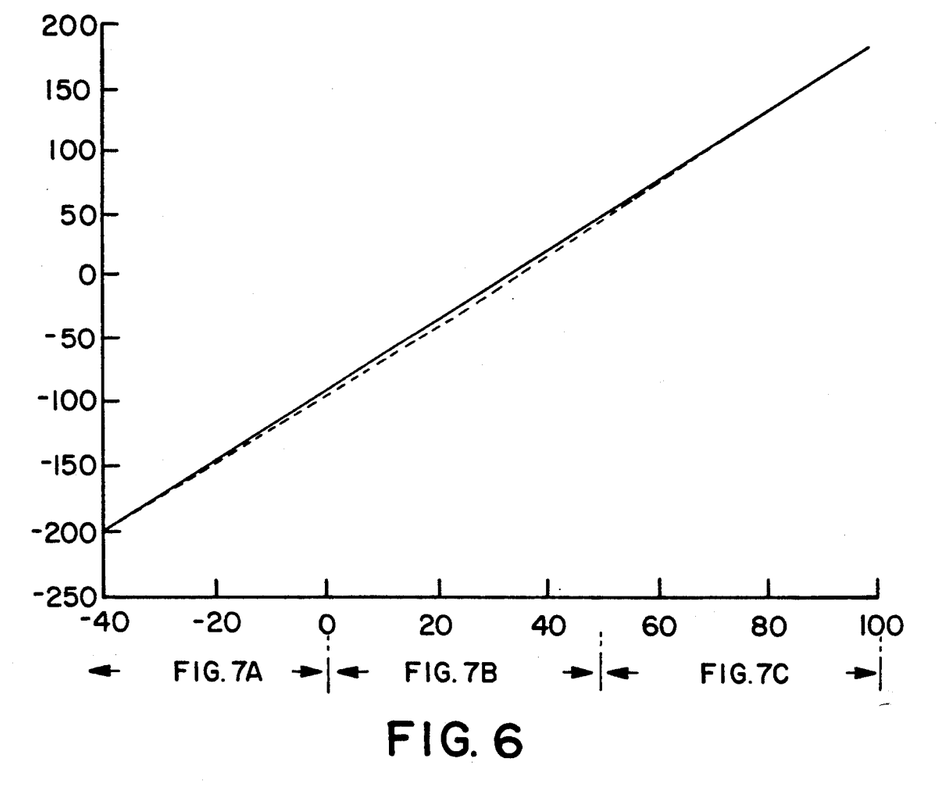
FIG. 6 is a two coordinate graphical illustration of actual and theoretical responses obtained with one embodiment constructed according to the principles of the currently disclosed invention.
Figure 7A:
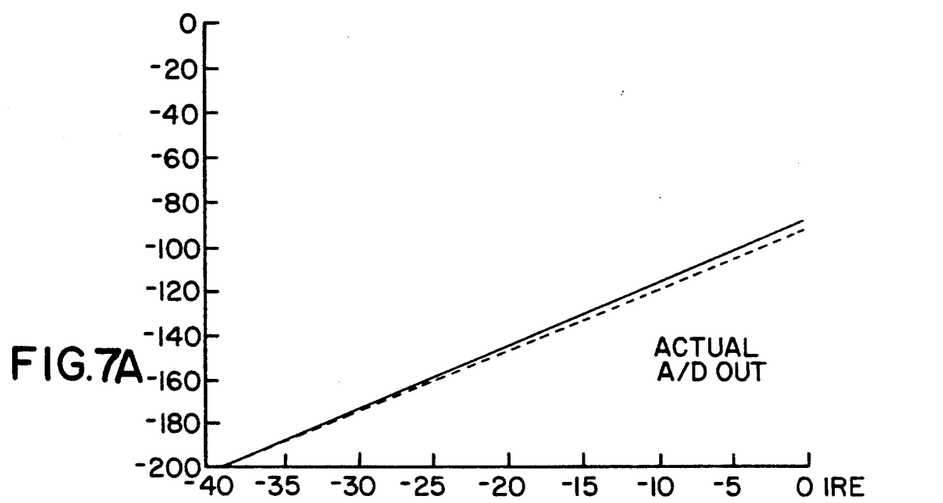
FIGS. 7A, 7B and 7C are two coordinate graphical illustrations providing expanded presentation of the detail of adjoining sections of the values illustrated in the graphical representation of FIG. 6.
Figure 7B:
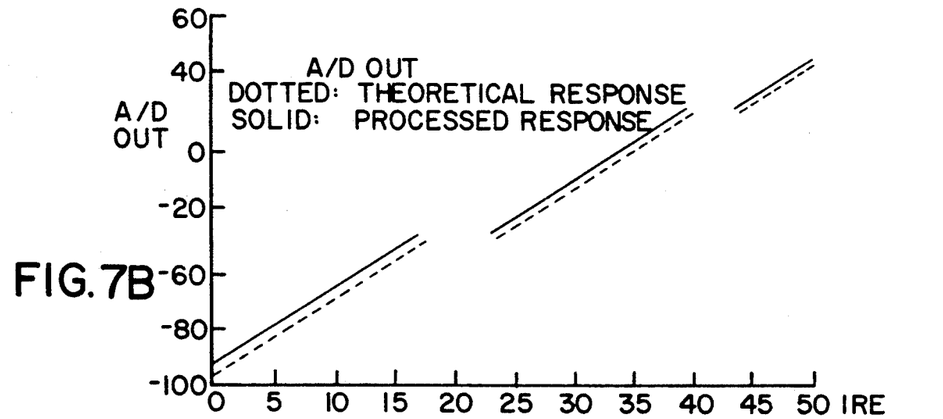
Figure 7C:
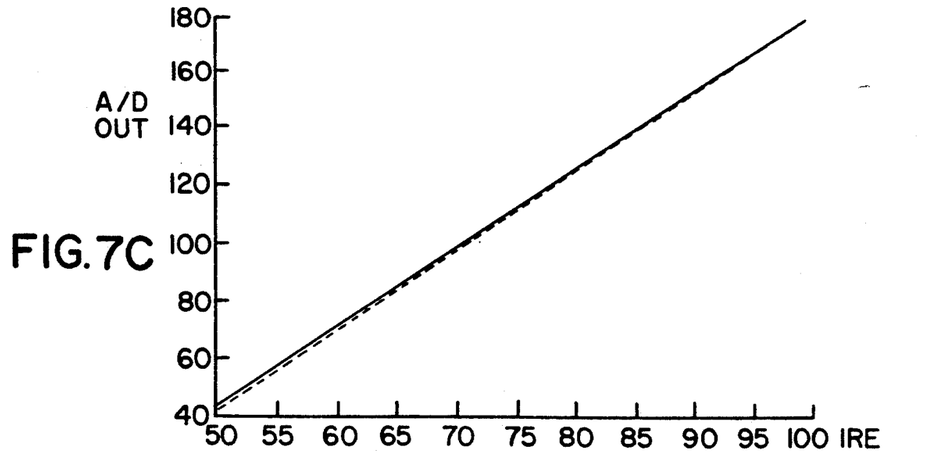

The plots illustrated in FIGS. 6, 7A, 7B and 7C were made for a TRW nine bit analog-to-digital converter evaluation board, Model No. TDC 1020 E1C. FIG. 6 provides a two coordinate graphical illustration of actual and theoretical responses obtained with one embodiments constructed according to the foregoing principles currently disclosed, while FIGS. 7A, 7B and 7C shown enlarged two coordinate graphical illustrations providing expanded presentation of the detail of adjoining sections of the values illustrated in the graphical representation of FIG. 6. The plots of FIGS. 6, 7A, 7B and 7C show analog-to-digital output $V_o$ (as dashed lines) and corrected values (as solid lines) using above described concept. The expanded views clearly depict that the nonlinearity can be practically eliminated over the entire digitizing range.

We claim:

1. An analog-to-digital converter, comprising:

converter means for converting amplitudes of a plurality of corresponding successive intervals of an analog signal into first digital values representative of said successive intervals of said analog signal, said converting means being of a substantially linear type in which the change in amplitude over each successive interval is substantially similar to each of the changes in amplitude over each of the other of those successive intervals and said first digital values are numbers that change in their lease significant place when said analog signal goes from one of said successive intervals to the adjoining one; and storage means for storing a plurality of second digital values at different corresponding ones of a plurality of distinct addresses, said plurality of distinct addresses corresponding to specific ones of said plurality of first digital values, said plurality of second digital values extending over a range and exhibiting a linear relation over said range to said amplitudes of said analog signal, and for responding to reception of said first digital values by addressing said linear values stored at corresponding ones of said plurality of distinct address.

2. The converter of claim 1, further comprising:

means for applying during at least one selected time, directly and without compression to said converting means as said analog signal, a test signal successively exhibiting values of said amplitude corresponding to specific ones of said plurality of first digital values:

means for providing for each successively exhibited value of said amplitude in said test signal, a corresponding one of said plurality of second digital values; and means operable during each said selected time for reading said plurality of second digital values into said storage means at addresses corresponding to said first digital values.

3. An analog-to-digital converter, comprising:

converting means for converting a substantially linear characteristic consisting of a plurality of successive equal intervals of an analog signal into first digital values representative of said successive intervals of said analog signal; and storing means coupled to said converting means to receive said first digital values, for storing a plurality of second digital values at different corresponding ones of a plurality of distinct addresses, said plurality of second digital values extending over a range and exhibiting a linear relation over said range to said characteristic of said analog signal as applied directly without compression to said converting means, and for responding to reception of said first digital values by providing said linear values stored at corresponding ones of said plurality of distinct addresses.

4. The converter of claim 3, further comprising:

means for applying during at least one selected time, directly and without compression to said converting means as said analog signal, a test signal successively exhibiting values of said amplitude corresponding to specific ones of said plurality of first digital values;

means for providing for each successively exhibited value of said amplitude in said test signal, a corresponding one of said plurality of second digital values; and means operable during each said selected time for reading said plurality of second digital values into said storage means at addressed corresponding to said first digital values.

5. The converter of claim 4 wherein at times other than said selected times said converting means responds to the amplitude of said analog signal in accordance with said characteristic, by converting successive samples of said amplitude into digital words, each having one of said first digital values.

6. The converter of claim 3 wherein said converter means responds to the amplitude of said analog signal in accordance with said characteristic, by converting successive samples of said amplitude into digital words, each having one of said first digital values.

7. A method for linearizing an analog-to-digital converter responding to any analog input signal applied thereto to generate digital output signal substantially linearly related to that said analog input signal, said method using a random access memory, said method comprising the steps of:

initially, in a procedure to write said random access memory simultaneously supplying a prescribed test signal comprising successive samples of differing levels directly to said analog-to-digital converter as said analog input signal thereto, supplying to said random access memory as write input data a digital number linearly related to the level of each sample currently supplied to said analog-to-digital converter as said analog input signal thereto, and conditioning said random access memory to store write input data supplied thereto at locations addressed by the digital output signal of said analog-to-digital converter generated responsive to the successive samples of differing levels in said prescribed test signal, while addressing said random access memory with the digital output signal of said analog-to-digital converter; and thereafter, in a procedure to read from said random access memory a linearized digital response to analog input signal other than said prescribed test signal, supplying said other analog input signal to said analog-to-digital converter, and conditioning said random access memory to read the contents stored in addressed said locations thereof, while continuing to address said random access memory with the digital output signal of said analog-to-digital converter.

* * * * *

UNITED STATES PATENT AND TRADEMARK OFFICE
CERTIFICATE OF CORRECTION

PATENT NO. : 5,196,851
DATED : 23 March 1993
INVENTOR(S) : Chandrakant B. Patel, et al.

It is certified that error appears in the above-identified patent and that said Letters Patent is hereby corrected as shown below:

Claim 1, Column 5, Line 16, replace "lease" with --least--.

Signed and Sealed this

Thirtieth Day of November, 1993

Attest:

BRUCE LEHMAN

*Attesting Officer*    *Commissioner of Patents and Trademarks*